United States Patent
Moon et al.

(10) Patent No.: US 11,867,753 B2
(45) Date of Patent: Jan. 9, 2024

(54) PROBE ASSEMBLY AND MICRO VACUUM PROBE STATION COMPRISING SAME

(71) Applicant: NEXTRON CORPORATION, Busan (KR)

(72) Inventors: Hakbeom Moon, Gyeongsangnam-do (KR); Yunhyeong Jang, Busan (KR); Jisu Seong, Gyeongsangnam-do (KR); Nakyeong Kim, Busan (KR)

(73) Assignee: NEXTRON CORPORATION, Busan (KR)

( * ) Notice: Subject to any disclaimer, the term of this patent is extended or adjusted under 35 U.S.C. 154(b) by 30 days.

(21) Appl. No.: 17/433,420

(22) PCT Filed: May 7, 2019

(86) PCT No.: PCT/KR2019/005410
§ 371 (c)(1),
(2) Date: Aug. 24, 2021

(87) PCT Pub. No.: WO2020/226194
PCT Pub. Date: Nov. 12, 2020

(65) Prior Publication Data
US 2022/0137123 A1 May 5, 2022

(51) Int. Cl.
| G01R 31/28 | (2006.01) |
| G01R 1/04 | (2006.01) |
| G01R 1/067 | (2006.01) |
| G01R 1/073 | (2006.01) |
| G01N 27/02 | (2006.01) |
| G01R 27/14 | (2006.01) |

(52) U.S. Cl.
CPC ..... G01R 31/2889 (2013.01); G01R 1/06727 (2013.01); G01R 31/2881 (2013.01)

(58) Field of Classification Search
CPC ............... G01R 31/28; G01R 31/2881; G01R 31/2889; G01R 1/04; G01R 1/067; G01R 1/06727; G01R 1/073; G01R 27/14; G01N 27/02
See application file for complete search history.

(56) References Cited

U.S. PATENT DOCUMENTS

| 2015/0293042 A1* | 10/2015 | Hosaka ............... G01R 31/2875 324/105 |
| 2017/0052216 A1 | 2/2017 | Campbell et al. |
| 2019/0004087 A1 | 1/2019 | Li et al. |

FOREIGN PATENT DOCUMENTS

| JP | 2000-150595 A | 5/2000 |
| KR | 10-2005-0031873 | 4/2005 |

(Continued)

OTHER PUBLICATIONS

International Search Report, International Patent Application No. PCT/KR2019/005410, dated Feb. 6, 2020, 2 pages.

*Primary Examiner* — Neel D Shah
(74) *Attorney, Agent, or Firm* — CASIMIR JONES, SC; Robert A. Goetz

(57) ABSTRACT

A probe assembly and a micro vacuum probe station comprising same are disclosed. A probe assembly according to one embodiment may comprise: a base; a guide rail installed on the base; a guide member sliding along the guide rail; a probe connected to the guide member and of which one side contacts a wafer to inspect electrical properties of the wafer; and a thin film connector connected to the other side of the probe so as to supply electricity to the probe.

12 Claims, 6 Drawing Sheets

(56) References Cited

FOREIGN PATENT DOCUMENTS

| KR | 10-2009-0046086 A | 5/2009 |
|----|-------------------|--------|
| KR | 10-2009-0125509   | 12/2009 |
| KR | 10-2009-0125509 A | 12/2009 |
| KR | 100951717 B1      | 4/2010 |
| KR | 10-2010-0057118 A | 5/2010 |
| KR | 101055343 B1      | 8/2011 |
| KR | 10-1724954 B1     | 4/2017 |

* cited by examiner

PROBE ASSEMBLY AND MICRO VACUUM PROBE STATION COMPRISING SAME

TECHNICAL FIELD

Example embodiments relate to a probe assembly and a micro vacuum probe station including the probe assembly.

BACKGROUND ART

In a semiconductor manufacturing process, the material properties of a solid liquid sample formed on a wafer or base substrate may need to be examined. For example, electromagnetic, dielectric, optical, and chemical properties may need to be examined. Characteristics of a device may be affected by external factors, and thus an environment with the regulated vacuum state, light radiation, gas, temperature, and humidity may need to be provided in a process of detecting the characteristics of the device.

To detect the properties of a sample, a vacuum probe system that provides a chamber in which the sample is to be disposed may be provided. The vacuum probe system may detect characteristics of a device through a probe contacting the device. The vacuum probe system may include an adjuster that precisely moves the probe, and the adjuster may be disposed inside or outside the chamber.

In a case where the probe and the adjuster are disposed inside the chamber, the space of the chamber may increase, and a greater amount of time may thus be used to exhaust vacuum. In addition, as the size of the internal space of the chamber increases, controlling humidity and temperature may become harder in proportion to the increasing size, and external factors including unnecessary outgas may come into action. Thus, when the size of the chamber increases, the accuracy in measurement and analysis may be degraded. In contrast, in a case where the adjuster is disposed outside the chamber, a configuration of an instrument part for vacuum sealing inside and outside the chamber may become complicated and increase the cost, and the overall size may increase. In addition, installing the probe and the adjuster inside the chamber may have electrical, mechanical, and economic limitations. Thus, there is a desire for a small probe system that may effectively detect characteristics of a device while having both a probe and an adjuster disposed inside a chamber.

DISCLOSURE OF THE INVENTION

Technical Goals

An aspect provides a micro vacuum probe station having a probe assembly disposed inside a chamber to detect an electrical property of a sample.

Another aspect provides a probe assembly that accurately detects an electrical property of a sample irrespective of characteristics of an applied power supply and a micro vacuum probe station including the probe assembly.

Still another aspect provides a probe assembly that measures various properties of a sample in various changing environments with a high level of accuracy, and a micro vacuum probe station including the probe assembly.

Technical Solutions

According to an example embodiment, there is provided a probe assembly including a base, a guide rail installed on the base, a guide member configured to slide along the guide rail, a probe connected to the guide member and configured to examine an electrical property of a sample as one side thereof is brought into contact with the sample, and a thin film connector connected to the other side of the probe such that electricity is applied to the probe.

The thin film connector may include a substrate layer including polyimide, a conductive layer including copper and stacked on one surface of the substrate layer, and a cover layer stacked on one surface of the substrate layer to cover the conductive layer.

The conductive layer may include a first conductive portion and a second conductive portion stacked on the substrate layer such that the first conductive portion and the second conductive portion are disposed at both ends of the substrate layer, and include a third conductive portion stacked on the substrate layer such that the third conductive portion is disposed between the first conductive portion and the second conductive portion. The first conductive portion, the second conductive portion, and the third conductive portion may be separated from one another.

The probe assembly may further include a connecting portion configured to connect the guide member and the probe. The probe may be connected to the connecting portion such that the probe is rotatable on an axis perpendicular to the ground.

The connecting portion may include a connecting member connected to the guide member and having, in an upper portion thereof, an insertion groove into which a portion of the probe is to be inserted, a shaft provided in the connecting member to pass through the probe, and an elastic body connected to the shaft and configured to provide a restoring force such that the probe rotates in an opposite direction when the probe rotates through the shaft.

The probe may include a fixing portion connected to the guide member, an extension portion extending in a horizontal direction from one side of the fixing portion, and an examination portion extending downward from an end portion of the extension portion such that an end portion thereof comes into contact with the sample.

The probe may further include a bent portion configured to connect the fixing portion and the extension portion, and repeatedly bent such that the extension portion bends upward and downward with respect to the fixing portion.

The extension portion may include an adjustment groove formed by being bent upward. Into the adjustment groove, tweezers for manually adjusting a position of the probe may be inserted.

According to another example embodiment, there is provided a micro vacuum probe station including a housing having a chamber formed inside the housing and having an upper portion being opened, a housing cover connected to the upper portion of the housing to hermetically seal the chamber and including a transparent window, a vacuum port formed through the housing to form a vacuum in the chamber, an sample stage disposed in the chamber and on which a target sample is to be settled, and a probe assembly disposed in the chamber and configured to examine an electrical property of the sample as the probe assembly is brought into contact with the sample.

The probe assembly may include a base installed in the chamber, a guide rail provided in the base, a guide member configured to slide along the guide rail, a probe connected to the guide member and configured to examine the electrical property of the sample as one side thereof is brought into contact with the sample, and a thin film connector connected to the other side of the probe such that electricity is applied to the probe.

The thin film connector may include a substrate layer formed with an insulating material, a conductive layer stacked on one surface of the substrate layer and including three conductive portions disposed at both ends and a center of the substrate layer such that the conductive portions are separated from one another, and a cover layer stacked on one surface of the substrate layer to cover the conductive layer.

A direct current (DC) or alternating current (AC) voltage may be applied to the probe through the tine film connector.

The probe assembly may further include an elastic member disposed between a surface of a bottom of the chamber and the base.

The micro vacuum probe station may further include a cooling port formed through the housing such that a coolant flows into the chamber.

The sample stage may include a temperature adjuster configured to adjust a temperature of the sample.

Effects

According to an example embodiment described herein, a probe assembly and a micro vacuum probe station including the probe assembly may minimize the size of a chamber with the reduced size of the probe assembly, thereby reducing the amount of time used for a change in an environment such as vacuum exhaust and gas purging.

According to an example embodiment described herein, a probe assembly and a micro vacuum probe station including the probe assembly may be manufactured as being small in size and lightweight in volume, and may thus be readily compatible with an other instrument such as a microscope, a spectrometric analyzer, and the like.

According to an example embodiment described herein, a probe assembly and a micro vacuum probe station including the probe assembly may accurately detect an electrical property of a sample irrespective of characteristics of an applied power supply.

According to an example embodiment described herein, a probe assembly and a micro vacuum probe station including the probe assembly may improve accuracy in measurement by readily adjusting a movement of a probe with respect to a sample.

According to an example embodiment described herein, a probe assembly and a micro vacuum probe station including the probe assembly may fix a sample while detecting an electrical signal, and may thus respond to a vibration of a chamber and allow a direction and a movement of the chamber to be free.

BEST MODE FOR CARRYING OUT THE INVENTION

Hereinafter, some examples will be described in detail with reference to the accompanying drawings. However, various alterations and modifications may be made to the examples. Here, the examples are not construed as limited to the disclosure and should be understood to include all changes, equivalents, and replacements within the idea and the technical scope of the disclosure.

Although terms such as "first," "second," "A," "B," "(a)," "(b)," and the like may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Throughout the specification, when a component is described as being "connected to" or "coupled to" another component, it may be directly "connected to" or "coupled to" the other component, or there may be one or more other components intervening therebetween. In contrast, when an element is described as being "directly connected to" or "directly coupled to" another element, there can be no other elements intervening therebetween.

Figure 1:
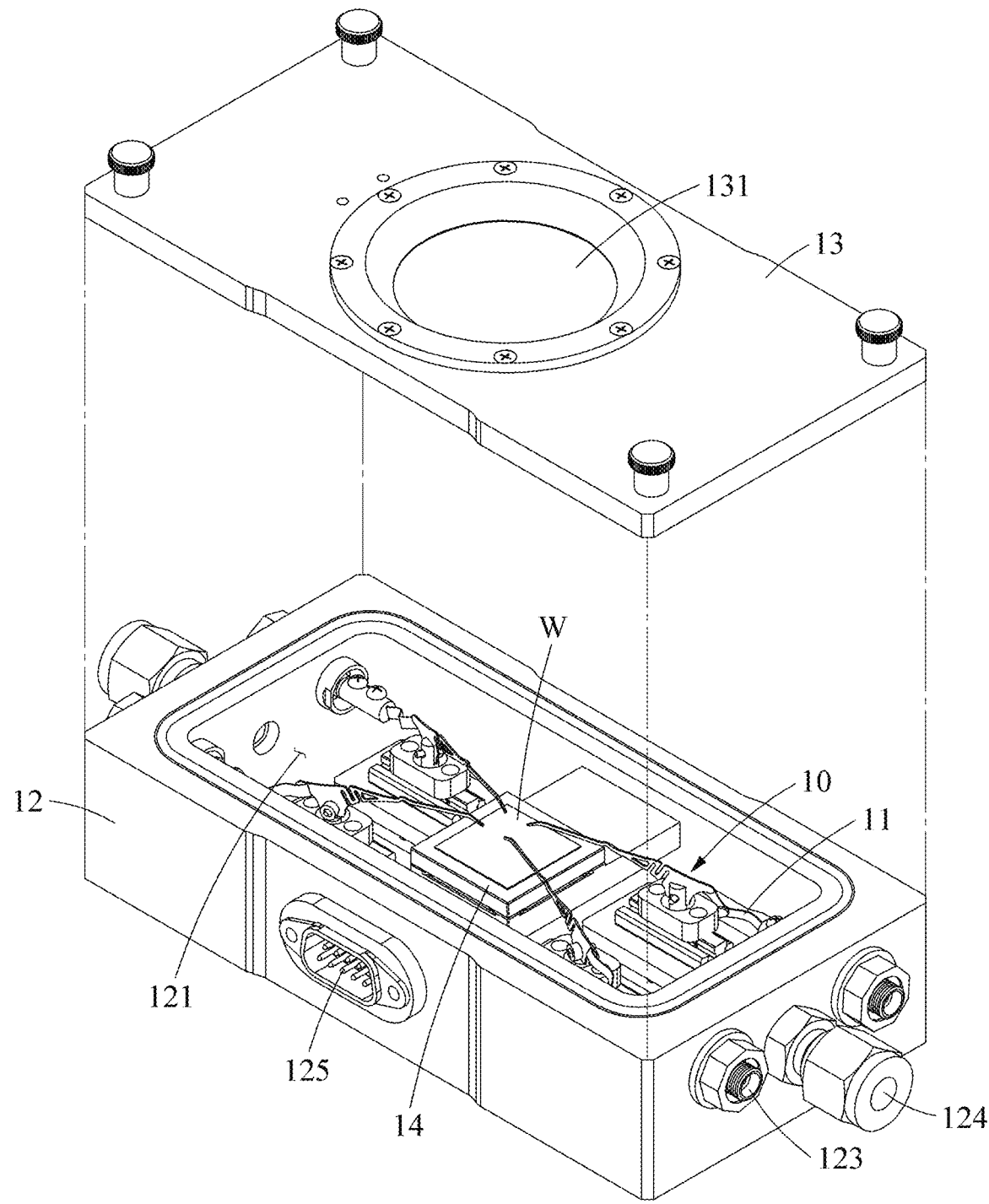
FIG. 1 is a perspective view of a micro vacuum probe station according to an example embodiment.
Figure 2:
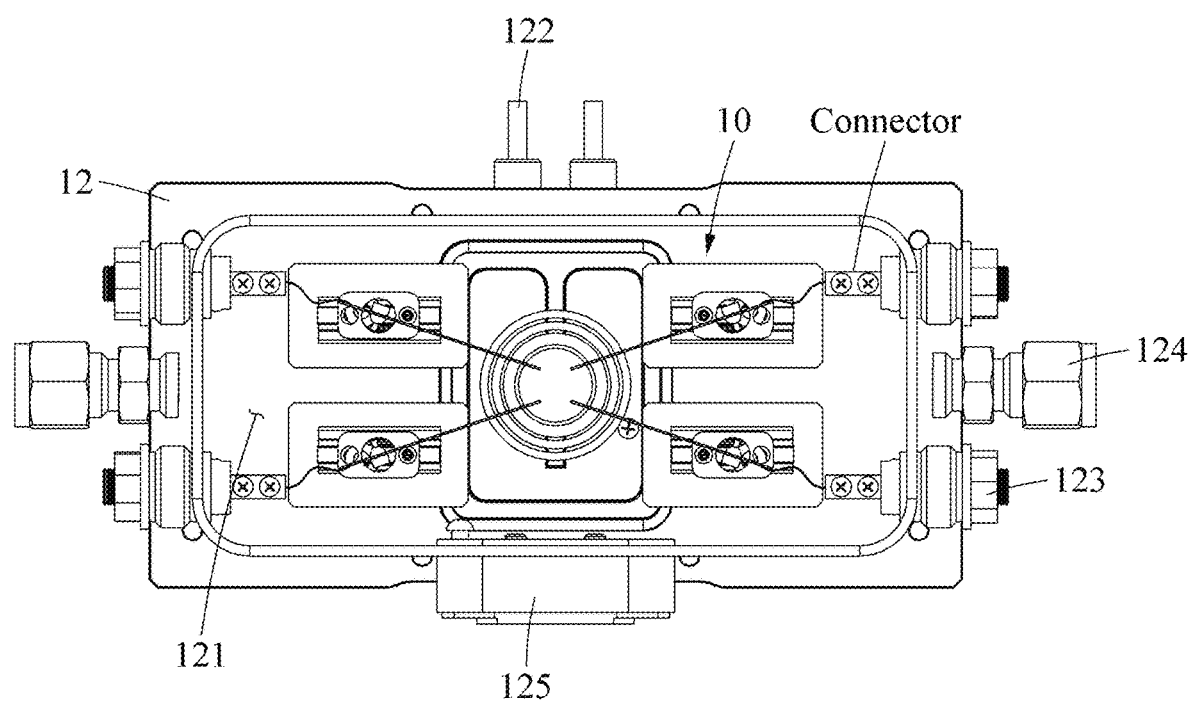
FIG. 2 is a plan view of a micro vacuum probe station according to an example embodiment.

FIG. 1 is a perspective view of a micro vacuum probe station according to an example embodiment. FIG. 2 is a plan view of a micro vacuum probe station according to an example embodiment.

Referring to FIGS. 1 and 2, according to an example embodiment, a micro vacuum probe station 1 may detect material properties of a sample W. The sample W may be, for example, a semiconductor device formed on a substrate (e.g., a wafer). Although the sample W is illustrated in a quadrangular form in FIG. 1, this is provided merely as an example and the sample W may be one of the various types of semiconductor devices formed on a wafer. The micro vacuum probe station 1 of the probe 106 may detect various properties, for example, electrical, optical, and chemical properties, of the sample W by interworking with another device. According to an example embodiment, the micro vacuum probe station 1 of the probe 106 includes a housing 12, a housing cover 13, a vacuum port 124, a cooling port 122, a signal port 123, a power connector 125, an sample stage 14, and a probe assembly 10.

The housing 12 may form an outer shape of the micro vacuum probe station 1 of the probe 106. The housing 12 may have a chamber 121 formed inside the housing 12, and an upper portion thereof may be opened. The chamber 121 may have a capacity less than or equal to 100 cubic centimeters (cc), for example. Using such a structure described in the foregoing, it is possible to form an inside of the chamber 121 to be in a vacuum state to examine the sample W, or rapidly purge gas in the inside of the chamber 121. Thus, even in a case in which the properties of the sample W are sensitive to an environment therearound, the micro vacuum probe station 1 of the probe 106 may accurately measure the properties of the sample W.

A sealing member that is disposed along a circumference of the chamber 121 may be provided on an upper surface of the housing 12. Thus, when the housing cover 13 and the housing 12 are connected to each other, the sealing member may seal a gap between the housing cover 13 and the housing 12, thereby allowing the chamber 121 to be hermetically sealed.

The housing cover 13 may be connected to the opened upper portion of the housing 12. The housing cover 13 may be selectively connected to the chamber 121 to close the chamber 121, thereby maintaining the vacuum state and the gas purging state inside the chamber 121. The housing cover 13 may have a fixing screw that is fixedly connected to the housing 12. For example, the fixing screw may be provided at an outer corner of the housing cover 13 and connected to a fixing groove (not shown) formed on an upper surface of the housing 12. The housing cover 13 may include a transparent window 131. The transparent window 131 may be formed with a transparent material that allows the inside of the chamber 121 to be observed from an outside. The transparent window 131 may be formed with a material, such as, for example, quartz, sapphire, glass, tempered glass, or acrylic. Using such a structure described in the foregoing, it is possible to detect an optical property of the sample W to by radiating light through the transparent window 131 from the outside, and to detect an optical property generated from the sample W by inputting an electrical signal.

The vacuum port 124 may be formed through the outside of the housing 12 from the inside of the chamber 121. The vacuum port 124 may be connected to an exhaust line to perform a function as a path for emitting gas in the chamber 121. The vacuum port 124 may be connected to an other instrument to perform a function as a path for removing air in the chamber 121. The vacuum port 124 may also be connected to an other instrument to inject gas and moisture into the chamber 121. For example, when gas and moisture are injected into the chamber 121 in a process of detecting a chemical property of the sample W, the vacuum port 124 may perform a function as a path for injecting gas.

The cooling port 122 may be formed through the housing 12 such that a coolant flows into the chamber 121. The coolant for cooling the housing 12 may be injected through the cooling port 122. For example, the cooling port 122 may communicate with a cooling passage (not shown) formed to pass through an inside of the sample stage 14 to be described hereinafter, and thus perform a function as a path for injecting and discharging a coolant for cooling the sample stage 14. Using such a structure described in the foregoing, it is possible to adjust the temperature of the sample W disposed on the sample stage 14 by the flow of the coolant through the cooling port 122.

The signal port 123 may be formed through the housing 12 to connect a signal line for transmitting and receiving an electrical signal from the probe 106 to be described hereinafter. The signal port 123 may be connected to a connector that is connected to the probe 106, and connect an external signal line and the connector even in a vacuum or gas purging state maintained in the chamber 121.

The power connector 125 may perform a function as a connector for supplying power to the micro vacuum probe station 1 of the probe 106 and transmitting a direct current (DC) signal such as a signal of a temperature and humidity sensor.

The sample stage 14 may be provided in the chamber 121, and a target sample, for example, the sample W, for which an examination is to be performed may be settled on the sample stage 14. The sample stage 14 may be disposed at a center of the chamber 121. The sample stage 14 may include a temperature adjuster (not shown) to adjust the temperature of the sample W. The temperature adjuster may include, for example, a thermoelement formed as a peltier element, a resistive heater, and various heat exchangers. In such a case, the temperature adjuster may change the temperature of the sample stage 14 to adjust a target temperature of the sample W accurately and rapidly.

The cooling passage that communicates with the cooling port 122 may be provided in the sample stage 14. The coolant flowing in the chamber 121 through the cooling port 122 may reduce the temperature of the sample stage 14 while flowing along the cooling passage and then be discharged to the outside of the chamber 121.

Thus, the sample stage 14 may precisely adjust the temperature of the target sample W through the temperature adjuster and the cooling passage.

The probe assembly 10 may be disposed inside the chamber 121, and detect an electrical property of the sample W by contacting the sample W. The probe assembly 10 may be disposed around the sample stage 14. The probe assembly 10 may be provided as a plurality of probe assemblies, and the probe assemblies may simultaneously detect an electrical property of respective corresponding points of the sample W.

Figure 3:
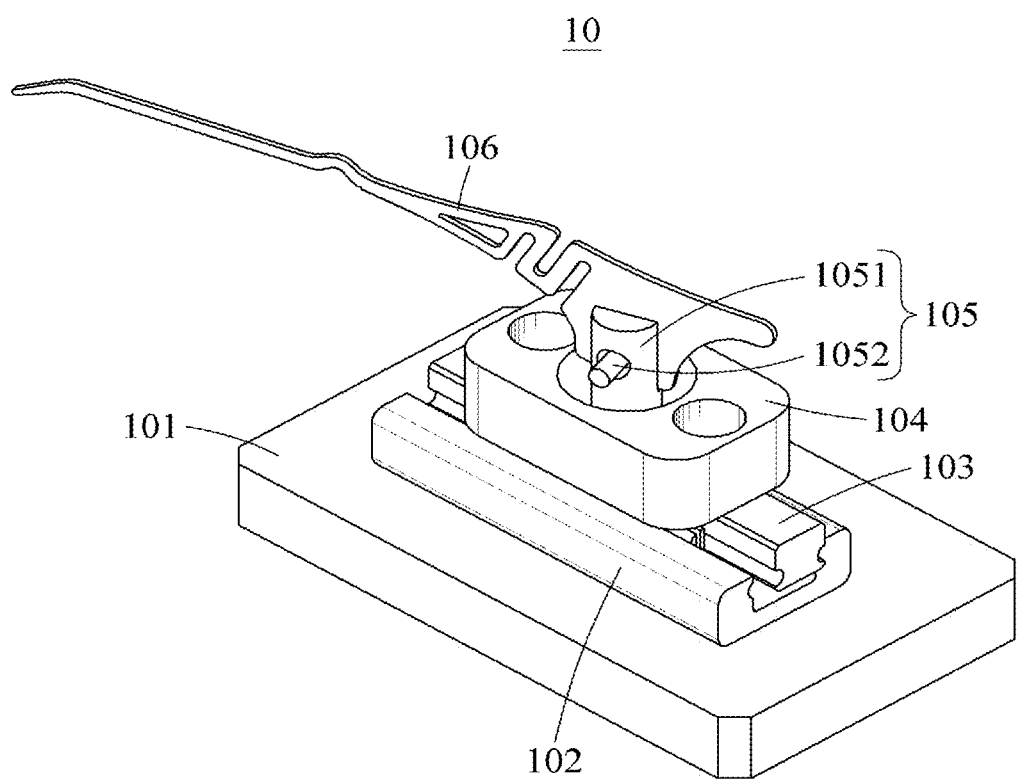
FIG. 3 is a perspective view of a probe assembly according to an example embodiment.
Figure 4:
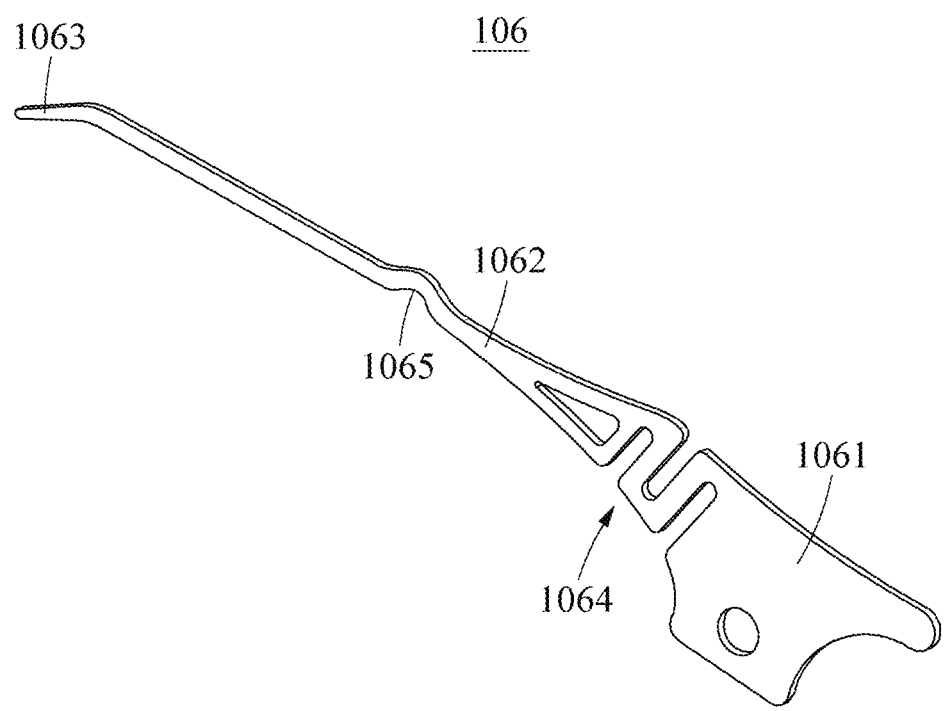
FIG. 4 is a side perspective view of a probe according to an example embodiment.

FIG. 3 is a perspective view of a probe assembly according to an example embodiment. FIG. 4 is a side perspective view of a probe according to an example embodiment.

Referring to FIGS. 3 and 4, the probe assembly 10 includes a base 101, a guide rail 102, a guide member 104, a connecting portion 105, the probe 106, and a thin film connector 11.

The base 101 may be installed on a bottom inside the chamber 121. A through groove that passes through in a vertical direction may be formed in the base 101. A screw may be inserted in the through groove to fix the base 101 to the bottom inside the chamber 121. The base 101 may be fixedly installed with a certain spacing separated from a surface of the bottom inside the chamber 121. In such a case, a plurality of elastic members (not shown) may be provided between the surface of the bottom of the chamber 121 and the base 101. The elastic members may have the same length and be disposed at both ends of the base 101. The elastic members may provide elasticity to allow the base 101 to be parallel to the surface of the bottom of the chamber 121. For example, when the probe 106 is brought into contact with the sample W, the base 101 may be inclined with respect to the surface of the bottom of the chamber 121 by an external force, allowing the probe 106 to be disposed on the sample W. In this example, the elastic members may provide elasticity to allow the base 101 to be parallel to the surface of the bottom of the chamber 121, thereby maintaining a state in which the probe 106 is in contact with the sample W. Thus, a certain force may act in a process of detecting an electrical property of the sample W, which may prevent the contact between the probe 106 and the sample W from being released. The spacing between the base 101 and the surface of the bottom may be adjusted through a screw, and elasticity provided by the elastic members may be adjusted by the spacing.

The guide rail 102 may be provided on the base 101, and the guide member 104 may slide along the guide rail 102. The guide rail 102 may be a linear motion (LM) guide, for example. The guide member 104 may move in a direction approaching or receding the sample stage 14 while sliding along the guide rail 102. Thus, through the movement of the guide member 104, a distance of the probe 106 with respect to the sample W in a horizontal direction may be adjusted.

The connecting portion 105 may be provided in the guide member 104. The connecting portion 105 may connect the guide member 104 and the probe 106. The probe 106 may be connected to the connecting portion 105 such that it rotates on an axis perpendicular to the ground. According to an example embodiment, the connecting portion 105 includes a shaft 1051 and a connecting member 1052.

The shaft 1051 may be connected to an upper surface of the guide member 104 and include an insertion groove formed in an upper portion thereof. In the insertion groove, a portion of the probe 106, for example, a fixing portion 1061 of the probe 106 to be described hereinafter, may be inserted.

The connecting member 1052 may be connected to the shaft 1051 such that is passes through the probe 106 inserted in the insertion groove. As the probe 106 is inserted in a connecting hole that passes through a side surface of the shaft 1051, the connecting member 1052 may thus perform a function as a rotation axis of the probe 106 with respect to the shaft 1051.

The probe 106 may be connected to the guide member 104 through the connecting portion 105, and examine an electrical property of the sample W as one side of the probe 106 is brought into contact with the sample W. According to an example embodiment, the probe 106 includes the fixing portion 1061, an extension portion 1062, a bent portion 1064, an examination portion 1063, and an adjustment groove.

The fixing portion 1061 may be fixed to the connecting member 1052, and the connecting member 1052 may be connected to the guide member 104. The fixing portion 1061 includes an insertion hole that passes through a side surface to allow the connecting member 1052 to be inserted therein, and a contact portion formed on a rear end portion to be connected to the thin film connector 11. For a connection to the thin film connector 11, the connecting member 1052 between the fixing portion 1061 and the shaft 1051 may be used. Hereinafter, a direction of the probe 106 facing the sample W will be referred to as a front side or forward, and an opposite direction will be referred to as a rear side or backward, for the convenience of description.

The extension portion 1062 may extend in a horizontal direction from one side of the fixing portion 1061, for example, the front side of the fixing portion 1061. The extension portion 1062 may have a narrower width in a vertical direction compared to the fixing portion 1061, and be provided in the form of a thin pin.

The bent portion 1064 may connect the fixing portion 1061 and the extension portion 1062. As illustrated in FIG. 4, the bent portion 1064 includes a cut pattern that is bent repeatedly in the vertical direction to allow the extension portion 1062 to be bent in a vertical direction with respect to the fixing portion 1061 and thus to be connected. The bent portion 1064 may also form an elastic structure. For example, when the extension portion 1062 receives an external force in a vertical direction, upper sides of bent points of the bent portion 1064 may become closer to each other, while lower sides of the bent points may become farther from each other. Thus, the extension portion 1062 may be flexibly bent with respect to the fixing portion 1061 to be connected thereto. In addition, the bent portion 1064 may have elasticity, as in a spring. Thus, when the external force is removed, the bent portion 1064 may provide elasticity such that a connection state of the connecting portion 105 with respect to the fixing portion 1061 returns to its original state. However, this is provided merely as an example, and the probe 106 may be provided in the form in which the fixing portion 1061 and the extension portion 1062 are connected without the bent portion 1064.

The examination portion 1063 may extend downward from a front end portion of the extension portion 1062. Thus, as the examination portion 1063 is brought into direct contact with the sample W, the examination portion 1063 may detect an electrical property of the sample W. To minimize a contact area with the sample W, the examination portion 1063 may be provided in the form of a pin having a cross section that is narrowed toward an end. To the examination portion 1063, a commercially used probe pin or wire including any one of tungsten, platinum, rhodium, stainless steel, and Inconel alloy may be attached.

An adjustment portion 1065 may be formed in the extension portion 1062 or the bent portion 1064, or the fixing portion 1061, to assist manual position adjustment for the probe 106. The adjustment portion 1065 may be formed as a portion of the extension portion 1062 is bent upward and a groove is thus formed on a lower side. A pair of tweezers or an adjustment jig for the manual position adjustment for the probe 106 may be inserted into the adjustment portion 1065. For example, to adjust a position of the probe 106 with respect to the sample W, a user may perform a manual type of a method of manually adjusting the position of the probe 106 through the tweezers. In this example, the adjustment portion 1065 may provide a space into which the tweezers are to be inserted, thereby facilitating the manual position adjustment for the probe 106. Also, using a separate external precision positioner and a jig that connects the positioner and the adjustment portion 1065, it is possible to assist position adjustment or manipulation more precisely than using the tweezers.

The thin film connector 11 may be connected to the other side of the probe 106, for example, the contact portion of the probe 106, such that electricity is applied to the probe 106. The thin film connector 11 may be connected to the signal port 123 to apply electricity to the sample W through the probe 106 or transmit an electrical property of the sample W to the external signal line through the probe 106.

Figure 5:
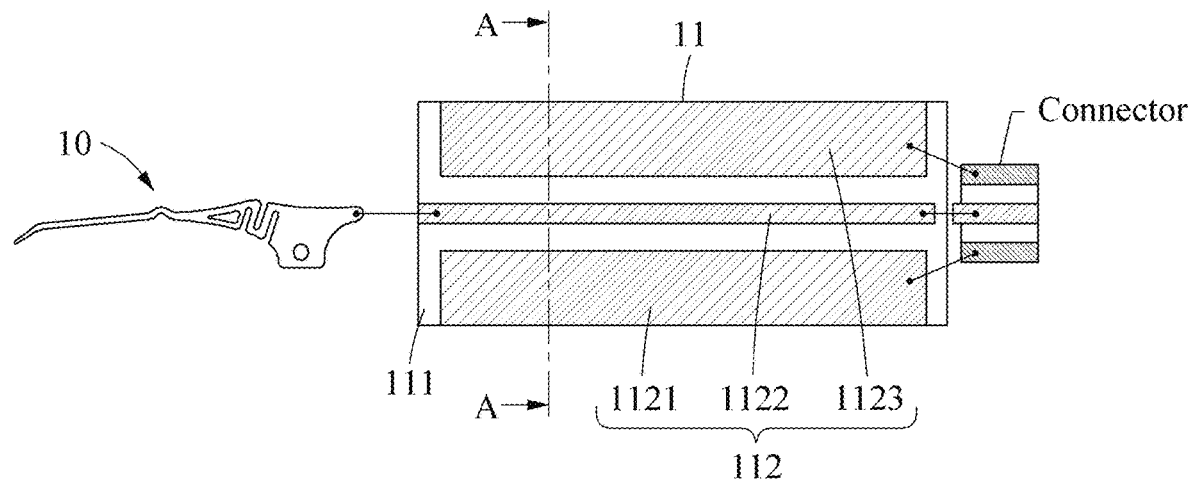
FIG. 5 is a side view of a thin film connector according to an example embodiment.
Figure 6:
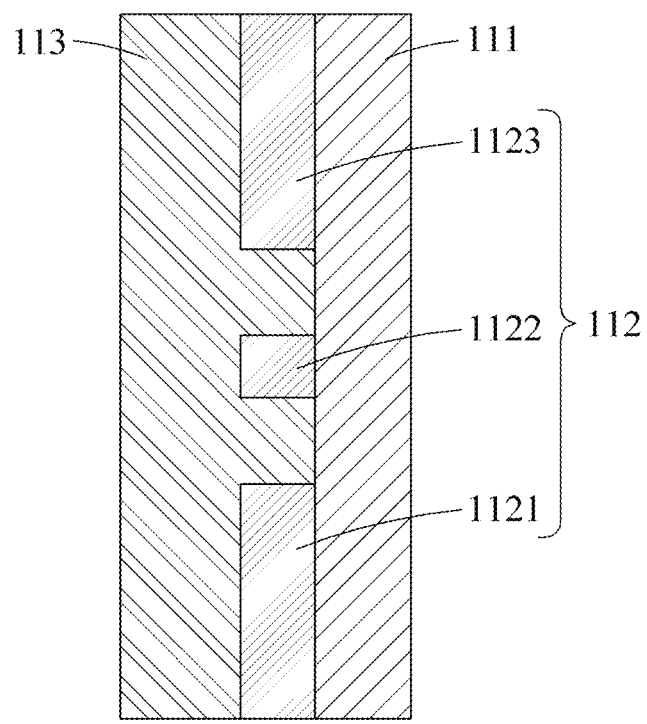
FIG. 6 is a cross-sectional view of the thin film connector of FIG. 5 cut by an A-A line.

FIG. 5 is a side view of a thin film connector according to an example embodiment. FIG. 6 is a cross-sectional view of the thin film connector of FIG. 5 cut by an A-A line.

Referring to FIGS. 5 and 6, the thin film connector 11 may be provided in the form of a thin film. According to an example embodiment, the thin film connector 11 includes a substrate layer 111, a conductive layer 112, and a cover layer 113.

The substrate layer 111 may be formed with an insulating material, for example, polyimide.

The conductive layer 112 may be stacked on one surface of the substrate layer 111. The conductive layer 112 may include a conductive material, for example, copper or gold. The conductive layer 112 may be divided into a first conductive portion 1121, a second conductive portion 1123, and a third conductive portion 1122. The first conductive portion 1121 and the second conductive portion 1123 may be stacked on one surface of the substrate layer 111 such that they are disposed at both ends of the substrate layer 111. The third conductive portion 1122 may be stacked on one surface of the substrate layer 111 such that it is disposed at a center of the substrate layer 111, that is, a position between the first conductive portion 1121 and the second conductive portion 1123. In such a case, the first conductive portion 1121, the second conductive portion 1123, and the third conductive portion 1122 may be stacked on the substrate layer 111 such that they are separated from one another.

The cover layer 113 may be stacked on one surface of the substrate layer 111 to cover the conductive layer 112. The cover layer 113 may be stacked in the substrate layer 111 to fill in a space among the first conductive portion 1121, the second conductive portion 1123, and the third conductive portion 1122. The cover layer 113 may be formed with an insulating material to prevent electricity flowing in the conductive layer 112 from being leaked out to a portion that is not the thin film connector 11.

A position of the probe 106 may be adjusted forward and backward with respect to the sample W, and thus the thin film connector 11 may maintain the connection between the probe 106 and the thin film connector 11 while adjusting a gap between the probe 106 and the thin film connector 11 based on the adjusted position of the probe 106. In the case of the thin film connector 11 of such a described structure, it is provided in the form of a film and is bent or spread based on an adjusted position of the probe 106, and may thus maintain the connection while adjusting the gap between the probe 106 and the thin film connector 11.

In addition, using the thin film connector 11 of the described structure, it is possible to minimize noise that may occur when an alternating current (AC) voltage is applied to the probe 106, compared to using another type of electric wire. The AC voltage may have an inconsistent waveform, and thus great noise may occur when the probe 106 and a connector are connected through a general-type conductive line. Thus, in such a case, it may not be possible to accurately detect an electrical property of the sample W. However, using the thin film connector 11 of the described structure, noise that may occur when using the AC voltage may be reduced greatly and it may thus be possible to use a voltage, irrespective of whether it is a DC voltage or an AC voltage, to examine the sample W.

As described above, the micro vacuum probe station 1 of the probe 106 may linearly move the probe 106 in a direction parallel to the ground or rotate the probe 106 on an axis perpendicular to the ground, thereby facilitating the adjustment of a position of the probe 106 with respect to the sample W. In addition, using the thin film connector 11 that maintains an electrical connection between the probe 106 and the thin film connector 11 irrespective of a change in the position of the probe 106, it is possible to reduce the size of itself and thus minimize the size of the chamber 121. Thus, the micro vacuum probe station 1 of the probe 106 may minimize the size of the chamber 121 and reduce the amount of time used to change the chamber 121 into a vacuum state or to purge gas, thereby accurately and rapidly detecting a change in properties of the sample W by a change in environment.

In addition, by adjusting the temperature of the observation station 14, it is possible to rapidly adjust the temperature to be applied to the sample W and accurately detect properties of the sample W based on the change in the temperature.

Further, as the size of a device is reduced, it is thus possible to increase the compatibility with an other instrument for optical measurement and the like.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. A probe assembly, comprising:
a base;
a guide rail installed on the base;
a guide member configured to slide along the guide rail;
a probe connected to the guide member and configured to examine an electrical property of a sample as one side thereof is brought into contact with the sample; and
a thin film connector connected to the other side of the probe such that electricity is applied to the probe, wherein the thin film connector comprises:
a substrate layer comprising polyimide;
a conductive layer comprising copper and stacked on one surface of the substrate layer; and
a cover layer stacked on one surface of the substrate layer to cover the conductive layer.

2. The probe assembly of claim 1, wherein the conductive layer comprises:
a first conductive portion and a second conductive portion stacked on the substrate layer such that the first conductive portion and the second conductive portion are disposed at both ends of the substrate layer, and a third conductive portion stacked on the substrate layer such that the third conductive portion is disposed between the first conductive portion and the second conductive portion,
wherein the first conductive portion, the second conductive portion, and the third conductive portion are separated from one another.

3. The probe assembly of claim 1, further comprising:
a connecting portion configured to connect the guide member and the probe,
wherein the probe is connected to the connecting portion such that the probe is rotatable on an axis perpendicular to the ground.

4. The probe assembly of claim 1, wherein the probe comprises:
a fixing portion connected to the guide member;
an extension portion extending in a horizontal direction from one side of the fixing portion; and
an examination portion extending downward from an end portion of the extension portion such that an end portion thereof comes into contact with the sample.

5. The probe assembly of claim 4, wherein the extension portion comprises:
an adjustment groove formed by being bent upward,
wherein, into the adjustment groove, tweezers for manually adjusting a position of the probe are inserted.

6. A probe assembly, comprising:
a base;
a guide rail installed on the base;
a guide member configured to slide along the guide rail;
a probe connected to the guide member and configured to examine an electrical property of a sample as one side thereof is brought into contact with the sample;
a thin film connector connected to the other side of the probe such that electricity is applied to the probe; and
a connecting portion configured to connect the guide member and the probe, wherein the connecting portion comprises:
a connecting member connected to the guide member and having, in an upper portion thereof, an insertion groove into which a portion of the probe is to be inserted;
a shaft provided in the connecting member to pass through the probe; and an elastic body connected to the shaft and configured to provide a restoring force such that the probe rotates in an opposite direction when the probe rotates through the shaft;

wherein the probe is connected to the connecting portion such that the probe is rotatable on an axis perpendicular to the ground.

7. A probe assembly, comprising:
a base;
a guide rail installed on the base;
a guide member configured to slide along the guide rail;
a probe connected to the guide member and configured to examine an electrical property of a sample as one side thereof is brought into contact with the sample, wherein the probe comprises:
　a fixing portion connected to the guide member;
　an extension portion extending in a horizontal direction from one side of the fixing portion;
　an examination portion extending downward from an end portion of the extension portion such that an end portion thereof comes into contact with the sample; and
　a bent portion configured to connect the fixing portion and the extension portion, and repeatedly bent such that the extension portion bends upward and downward with respect to the fixing portion; and
a thin film connector connected to the other side of the probe such that electricity is applied to the probe.

8. A micro vacuum probe station, comprising:
a housing having a chamber formed inside the housing and having an upper portion being opened;
a housing cover connected to the upper portion of the housing to hermetically seal the chamber and comprising a transparent window;
a vacuum port formed through the housing to form a vacuum in the chamber;
an sample stage disposed in the chamber and on which a target sample is to be settled; and
a probe assembly disposed in the chamber and configured to examine an electrical property of the sample as the probe assembly is brought into contact with the sample, wherein the probe assembly comprises:
　a base installed in the chamber;
　a guide rail provided in the base;
　a guide member configured to slide along the guide rail;
　a probe connected to the guide member and configured to examine the electrical property of the sample as one side thereof is brought into contact with the sample; and
　a thin film connector connected to the other side of the probe such that electricity is applied to the probe, wherein the thin film connector comprises:
　　a substrate layer formed with an insulating material;
　　a conductive layer stacked on one surface of the substrate layer, and comprising three conductive portions disposed at both ends and a center of the substrate layer such that the conductive portions are separated from one another; and
　　a cover layer stacked on one surface of the substrate layer to cover the conductive layer.

9. The micro vacuum probe station of claim 8, wherein, to the probe, an alternating current (AC) voltage is applied through the tine film connector.

10. The micro vacuum probe station of claim 8, wherein the probe assembly further comprises:
　an elastic member disposed between a surface of a bottom of the chamber and the base.

11. The micro vacuum probe station of claim 8, further comprising:
　a cooling port formed through the housing such that a coolant flows into the chamber.

12. The micro vacuum probe station of claim 8, wherein the sample stage comprises:
　a temperature adjuster configured to adjust a temperature of the sample.

* * * * *